United States Patent
Moriwaki (10) Patent No.: US 9,145,001 B2
(45) Date of Patent: Sep. 29, 2015

(54) OPTICAL RECORDING HEAD AND IMAGE FORMING APPARATUS

(75) Inventor: Hajime Moriwaki, Kawasaki (JP)

(73) Assignee: NEC ENGINEERING, LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/346,297

(22) PCT Filed: Aug. 30, 2012

(86) PCT No.: PCT/JP2012/072012
§ 371 (c)(1),
(2), (4) Date: Mar. 20, 2014

(87) PCT Pub. No.: WO2013/042522
PCT Pub. Date: Mar. 28, 2013

(65) Prior Publication Data
US 2014/0232811 A1    Aug. 21, 2014

(30) Foreign Application Priority Data

Sep. 22, 2011  (JP) .................................. 2011-207493

(51) Int. Cl.
*B41J 15/14*    (2006.01)
*B41J 27/00*    (2006.01)
(Continued)

(52) U.S. Cl.
CPC ............... *B41J 2/442* (2013.01); *G03F 7/2053* (2013.01); *G03F 7/24* (2013.01); *G03F 7/70075* (2013.01)

(58) Field of Classification Search
CPC ............... G02B 3/0006; G02B 3/0075; G02B 27/0916; G02B 27/0922; G02B 27/48; B41J 2/435; B41J 2/447; B41J 2/45

USPC ......... 347/110, 111, 224, 225, 238, 241–244, 347/256–258; 359/618, 619, 710, 796, 797
See application file for complete search history.

(56) References Cited

U.S. PATENT DOCUMENTS 4,884,857 A * 12/1989 Prakash et al. ............. 359/204.1
5,969,872 A * 10/1999 Ben Oren et al. ............ 359/621
(Continued)

FOREIGN PATENT DOCUMENTS

| CN | 1573410 A | 2/2005 |
| DE | 19643952 A1 | 5/1997 |

(Continued)

OTHER PUBLICATIONS

International Search Report (ISR) (PCT Form PCT/ISA/210), in PCT/JP2012/072012, dated Nov. 27, 2012.
(Continued)

*Primary Examiner* — Hai C Pham
(74) *Attorney, Agent, or Firm* — McGinn IP Law Group, PLLC.

(57) ABSTRACT

Image forming apparatus 10 of the present invention is an apparatus for forming an image on a surface of recording medium P by applying laser light to recording medium P, the apparatus including a plurality of light sources 31 each of which emits laser light, a plurality of optical fibers 23 and 42 through which laser light respectively emitted from light sources 31 propagates, holder 43 that holds optical fibers 42, and fly-eye lens 50, cylindrical lens array 60, aperture array 70, lens 80a and lens 80b through which laser light emitted from end surfaces of optical fibers 42 passes, wherein each of apertures 71 of aperture array 70 is rectangular.

16 Claims, 7 Drawing Sheets

(51) Int. Cl.
*B41J 2/44* (2006.01)
*G03F 7/24* (2006.01)
*G03F 7/20* (2006.01)

(56) References Cited

U.S. PATENT DOCUMENTS

| | | | |
|---|---|---|---|
| 6,975,659 B2 * | 12/2005 | Nagano et al. .................. | 372/36 |
| 2004/0164306 A1 | 8/2004 | Hongo et al. | |
| 2006/0060798 A1 | 3/2006 | Miyagawa | |
| 2008/0111983 A1 | 5/2008 | Singer et al. | |
| 2008/0212173 A1 | 9/2008 | Mizusawa | |

FOREIGN PATENT DOCUMENTS

| | | |
|---|---|---|
| EP | 1367442 A2 | 12/2003 |
| EP | 1637915 A1 | 3/2006 |
| JP | 11-329036 A | 11/1999 |
| JP | 2000-153636 A | 6/2000 |
| JP | 2004-253599 A | 9/2004 |
| JP | 2005-193581 A | 7/2005 |
| JP | 2006-085073 A | 3/2006 |

OTHER PUBLICATIONS

Chinese Search Report dated Apr. 3, 2015.
European Search Report dated Apr. 17, 2015.

* cited by examiner

OPTICAL RECORDING HEAD AND IMAGE FORMING APPARATUS

TECHNICAL FIELD

The present invention relates to an image forming apparatus for forming an image on a recording medium by applying light to the recording medium and to an optical recording head used in the image forming apparatus.

BACKGROUND ART

A system is known in which light is applied to a recording medium in the form of a sheet or a plate to form an image on a surface of the recording medium. A computer to plate (CTP) system for producing a printing plate for newspaper printing is an example of that kind of system. In the CTP system, laser light is applied to a resin layer formed on a surface of a base film or a base plate to form an image on the surface of the resin layer (expose the surface to the light).

The CTP system includes a rotating drum around which a recording medium is wrapped and an image forming apparatus that applies laser light to the recording medium wrapped around the rotating drum. The image forming apparatus includes an optical recording head capable of reciprocating along the axis of rotation of the rotating drum. When an image is formed on a recording medium by using the thus-constructed CTP system, laser light is emitted from the optical recording head of the image forming apparatus toward the recording medium surface (resin layer surface) while the rotating drum, around which the recording medium is wrapped, is being rotated. A portion of the resin layer surface is thereby exposed to the light. Subsequently, the optical recording head is moved through a predetermined distance along the axis of rotation of the drum. Thereafter, laser light is again emitted from the optical recording head toward the resin layer surface to expose a region adjacent to the region already exposed, to the light. The moving and stopping of the optical recording head is thereafter repeated to expose the entire area or a predetermined area of the resin layer surface to the light. In the following description, the direction of rotation of the rotating drum will sometimes be referred to as "main scanning direction" and the direction of movement of the optical recording head will sometimes be referred to as "sub-scanning direction". The sub-scanning direction and the direction along the axis of rotation of the rotating drum are parallel to each other.

The conventional image forming apparatus includes at least a plurality of semiconductor lasers as a light source and a plurality of optical fibers through which laser lights emitted from the semiconductor lasers propagate.

The plurality of semiconductor lasers and the plurality of optical fibers are connected in a one-to-one relationship with each other. Laser light emitted from one of the semiconductor lasers enters the corresponding one of the optical fibers from one end (starting end) of this optical fiber and exits from the other end (terminal end) thereof. The terminal end of each optical fiber is led into the optical recording head and held in the head. More specifically, the terminal ends of the plurality of optical fibers are held in the optical recording head so that their exit end surfaces are arranged in matrix form. Laser lights respectively emitted from the plurality of exit end surfaces which are arranged in matrix form are collected on the recording medium surface through a pair of collective lenses.

It is self-evident that an image formed on the recording medium is a set of a plurality of pixels, and that one spot of laser light emitted from one optical fiber corresponds to one pixel. That is, if ten optical fibers are provided, then light exposure for ten pixels at a maximum is performed at one time. If twenty optical fibers are provided, then light exposure for twenty pixels at a maximum is performed at one time.

CITATION LIST

Patent Literature

Patent Literature 1: JP 2000-153636 A
Patent Literature 2: JP 2005-193581 A

SUMMARY OF INVENTION

Technical Problem

In the conventional image forming apparatus, laser lights emitted from optical fibers are collected on a recording medium through collective lenses. Therefore, each spot of laser light formed on the recording medium is circular. However, if the spot is circular, the pixel is blurred. Four corners of each pixel in particular are blurred. As a result, the definition of the entire image that is a set of the plurality of pixels is reduced.

An object of the present invention is to enable the formation of an image having an improved definition by shaping each spot of laser light.

Solution to Problem

In the present invention, an aperture array in which rectangular apertures are formed is disposed on an optical path for laser light to be applied to a recording medium. Each spot of laser light applied to the recording medium is thereby shaped so as to be rectangular. As a result, the definition of an image is improved.

An optical recording head according to the present invention is an optical recording head for applying laser light respectively emitted from a plurality of optical fibers to a recording medium, the optical recording head including a holder that holds the plurality of optical fibers, a fly-eye lens into which laser light respectively emitted from end surfaces of the plurality of optical fibers enters, a cylindrical lens array into which laser light that passed through the fly-eye lens enters, an aperture array into which laser light that passed through the cylindrical lens array enters, and a lens that collects, on a surface of the recording medium, laser light that passed through apertures of the aperture array, wherein each of the apertures of the aperture array is rectangular.

An image forming apparatus according to the present invention is an image forming apparatus for forming an image on a surface of a recording medium by applying laser light to the recording medium, the apparatus including a plurality of light sources each of which emits laser light, a plurality of optical fibers through which laser light respectively emitted from the plurality of light sources propagates, a holder that holds end portions of the plurality of optical fibers, a fly-eye lens into which laser light respectively emitted from end surfaces of the plurality of optical fibers enters, a cylindrical lens array into which laser light that passed through the fly-eye lens enters, an aperture array into which laser light that passed through the cylindrical lens array enters, and a lens that collects, on a surface of the recording medium, laser light that passed through apertures of the aperture array, wherein each of the apertures of the aperture array is rectangular.

Advantageous Effects of Invention

According to the present invention, an image forming apparatus can be realized that is capable of forming an image whose definition is improved than ever before.

DESCRIPTION OF EMBODIMENTS

Figure 1:
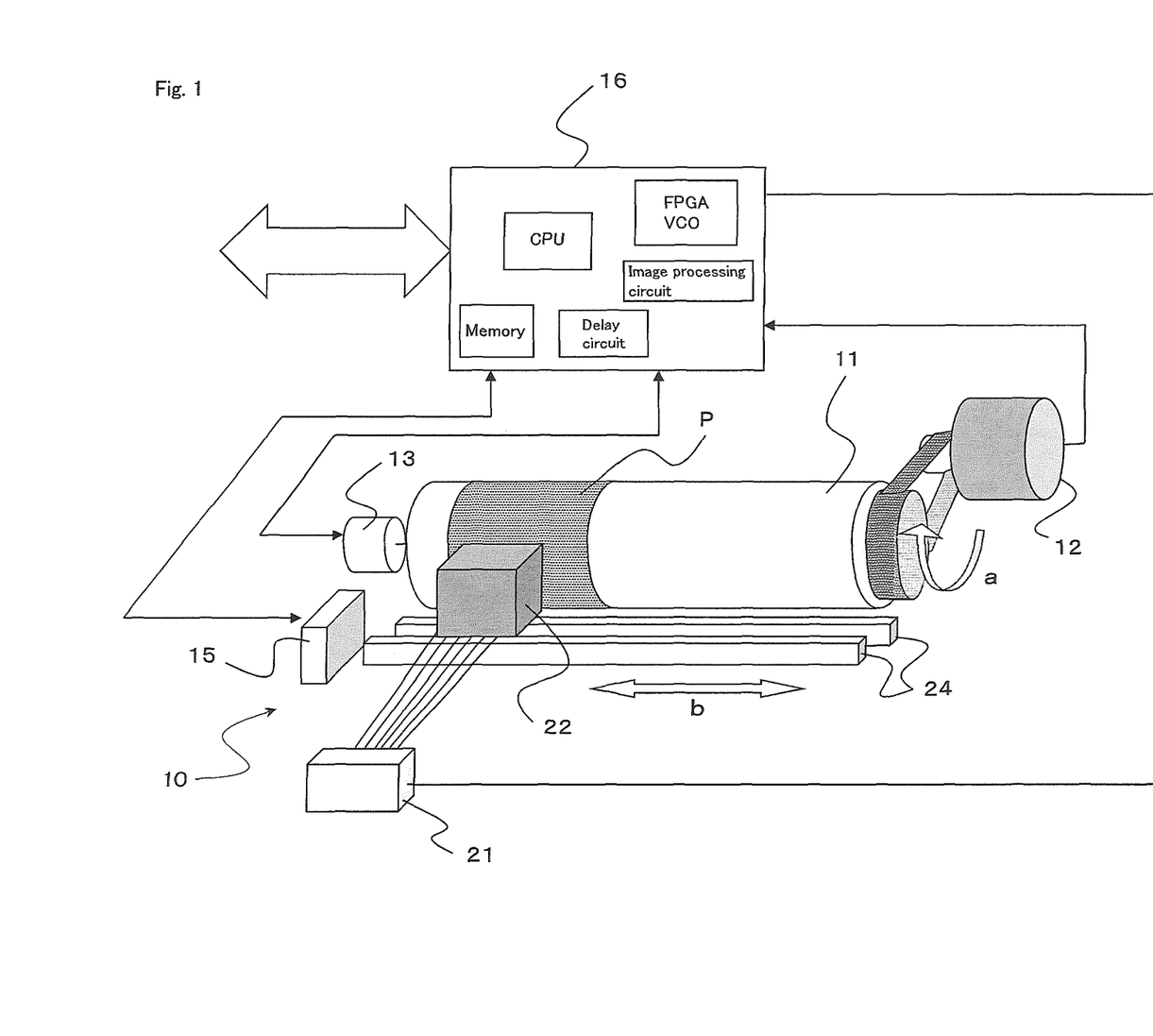
FIG. 1 is a configuration diagram showing an example of a CTP system to which the present invention is applied.

An example of a CTP system to which the present invention is applied will be described below. As shown in FIG. 1, a CTP system according to the present embodiment includes image forming apparatus 10, rotating drum 11 on which recording medium P is mounted, a motor (drum drive motor 12) for rotating rotating drum 11, encoder 13 for detecting the amount of rotation of rotating drum 11, head control unit 15 that controls optical recording head 22 of image forming apparatus 10, a motor (head drive motor) for moving optical recording head 22, and central control unit 16 that performs overall control on these components. The head drive motor is not shown in FIG. 1.

Central control unit 16 includes a memory, a central processing unit (CPU), a delay circuit, an image processing circuit, a field-programmable gate array (FPGA) and a voltage control oscillator (VCO). Central control unit 16 is supplied with various sorts of data and information including image data, control parameters and control data from a computer not shown. The supplied data and information are stored in the memory as needed. Further, central control unit 16 is connected to drum drive motor 12, encoder 13 and head control unit 15. Central control unit 16 monitors and controls drum drive motor 12 on the basis of data including the detection result from encoder 13 and data and parameters stored in the memory. Central control unit 16 also monitors and controls optical recording head 22 on the basis of data including the position and the speed of movement of optical recording head 22 detected by head control unit 15 and data and parameters stored in the memory.

Rotating drum 11 is cylindrical. Recording medium P is wrapped around a surface of rotating drum 11. In the present embodiment, a thermal plate that is recording medium P is wrapped around the surface. The thermal plate has at least a base plate made of aluminum and a resin layer including a photosensitive layer formed on a surface of the base plate. The thickness of the base plate is typically about 0.3 mm and the thickness of the photosensitive layer is typically 1.0 to 3.0 µm. The thicknesses of the base plate and the photosensitive layer are not limited to the above values.

The rotating shaft of rotating drum 11 and the rotating shaft of drum drive motor 12 are connected to each other through transmission mechanism 18 including pulleys and a belt. Therefore, when drum drive motor 12 is driven under the control of central control unit 16, the torque of drum drive motor 12 is transmitted to rotating drum 11 so that rotating drum 11 rotates in the main scanning direction (the direction of arrow a in the figure).

Figure 2:
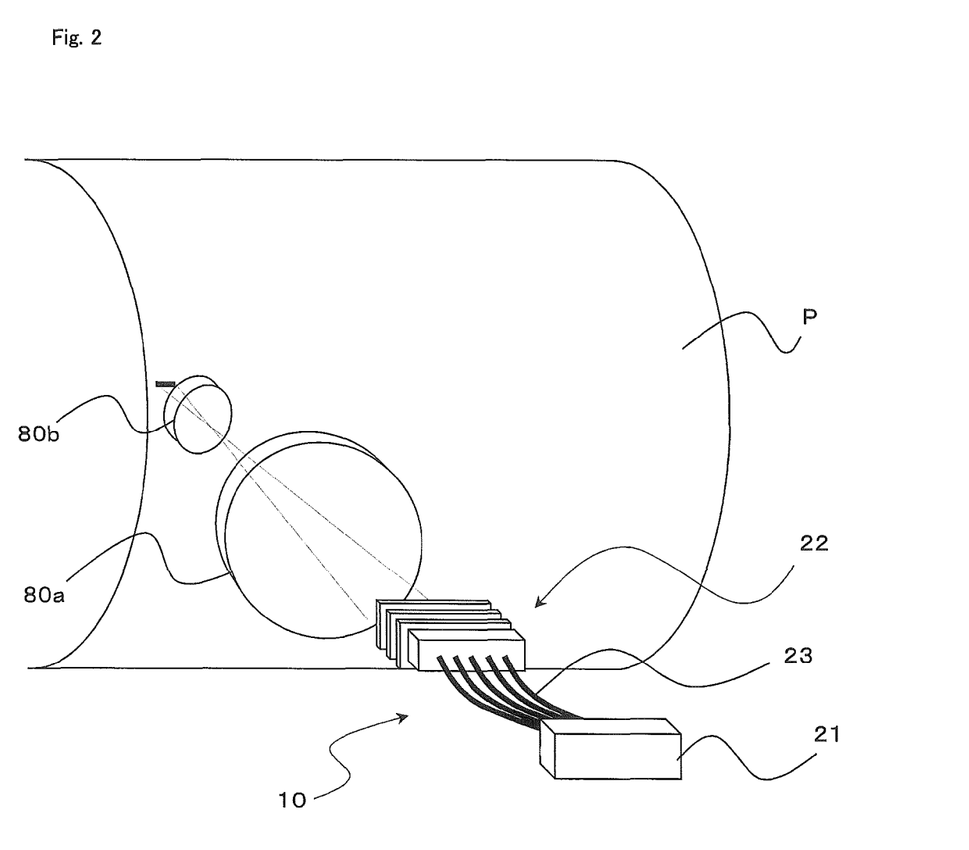
FIG. 2 is a schematic configuration diagram of an image forming apparatus included in the CTP system shown in FIG. 1.
Figure 3:
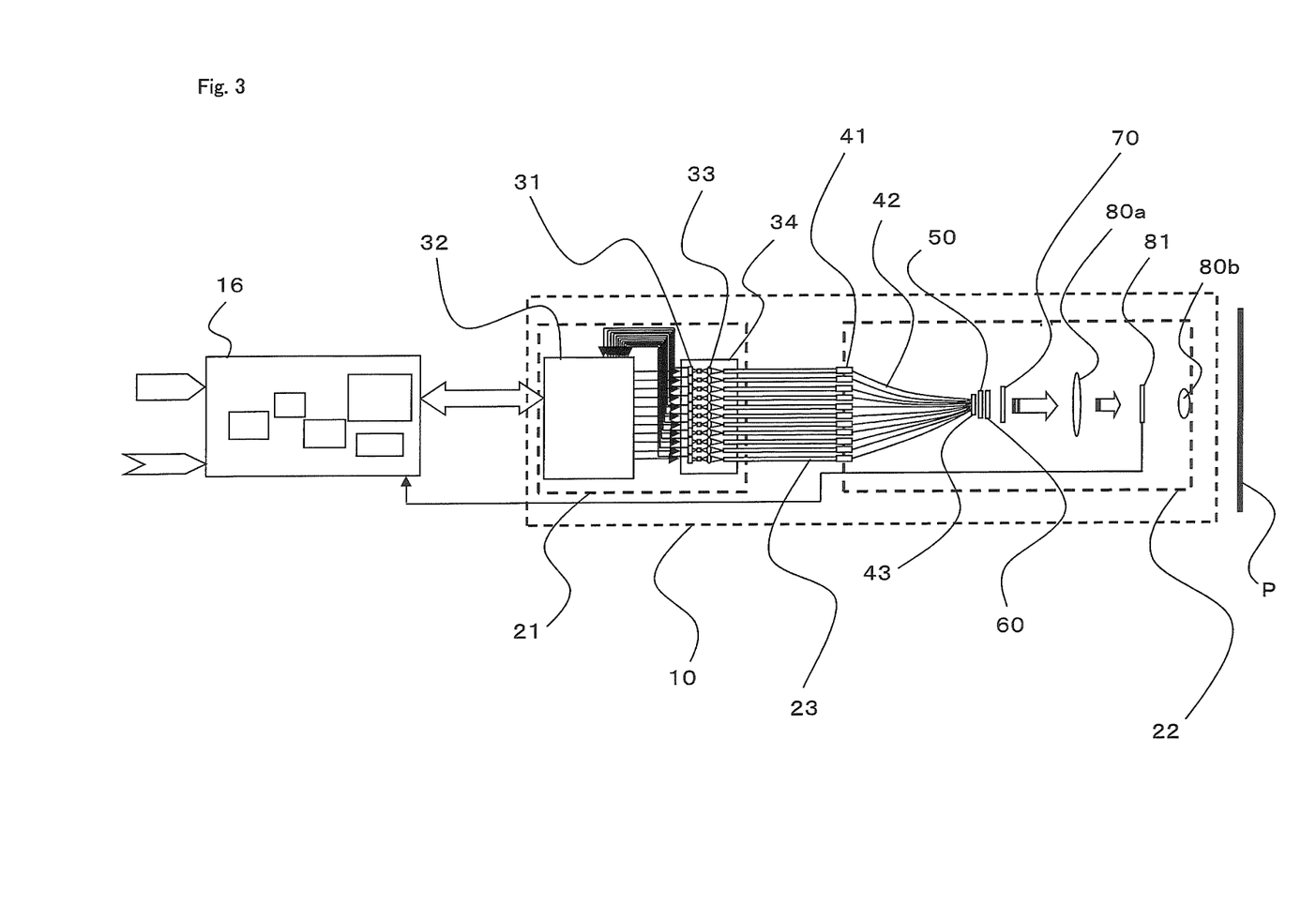
FIG. 3 is a detailed configuration diagram of the image forming apparatus shown in FIG. 2.

Image forming apparatus 10 will be next described in detail. As shown in FIGS. 2 and 3, image forming apparatus 10 includes light source unit 21, optical recording head 22 and a plurality of optical fibers 23 forming an optical waveguide between light source unit 21 and optical recording head 22.

As shown in FIG. 3, light source unit 21 includes a plurality of semiconductor lasers 31, driver 32 that drives semiconductor lasers 31, lenses 33 each of which causes laser light emitted from one of semiconductor lasers 31 to enter one predetermined optical fiber from among optical fibers 23, and cooling means (not shown) for cooling semiconductor lasers 31.

In the present embodiment, the oscillation wavelength of each semiconductor laser 31 is 830 nm. Semiconductor lasers 31, lenses 33 and the cooling means are provided on common substrate 34 and combined integrally with each other. Further, the starting end of each of optical fibers 23 is fixed on substrate 34. That is, semiconductor lasers 31, lenses 33, the cooling means and optical fibers 23 are combined in one unit.

In the present embodiment, sixty-four semiconductor lasers 31 are mounted on the mount surface of substrate 34, and sixty-four lenses 33 and sixty-four optical fibers 23 are provided in correspondence with semiconductor lasers 31. However, the number of semiconductor lasers 31 can be changed as desired and the numbers of lenses 33 and optical fibers 23 can also be changed according to the number of semiconductor lasers 31.

The cooling means for cooling semiconductor lasers 31 are provided on the back surface of substrate 34 (the surface opposite to the mount surface). The cooling means may be implemented, for example, by using a Peltier device. Air-cooling-type cooling means may alternatively be implemented by using a fan. Further, liquid-cooling-type cooling means may be implemented by using a cooling medium, a cooling medium circulation passage and a pump.

Optical recording head 22 will be next described in detail. Optical recording head 22 includes optical connectors 41 to which the terminal ends of optical fibers 23 are detachably attached, a plurality of optical fibers (sixty-four optical fibers in the present embodiment) 42 respectively connected to optical fibers 23 through optical connectors 41, holder 43 that holds the terminal ends of optical fibers 42, and an optical system that brings laser lights emitted from optical fibers 42 to the surface of recording medium P. This optical recording head 22 moves in the sub-scanning direction (in the direction of arrow b in the figure) along two guide rails 24 shown in FIG. 1 when the head drive motor is driven under the control of central control unit 16.

The above-mentioned optical system incorporated in optical recording head 22 includes fly-eye lens 50 into which laser lights emitted from the exit end surfaces of optical fibers 42 enter, cylindrical lens array 60 into which laser lights emitted from fly-eye lens 50 enter, aperture array 70 into which laser lights emitted from cylindrical lens array 60 enter, lens 80a into which laser lights that passed through aperture array 70 enter, and lens 80b into which laser lights emitted from lens 80a enter.

Figure 4:
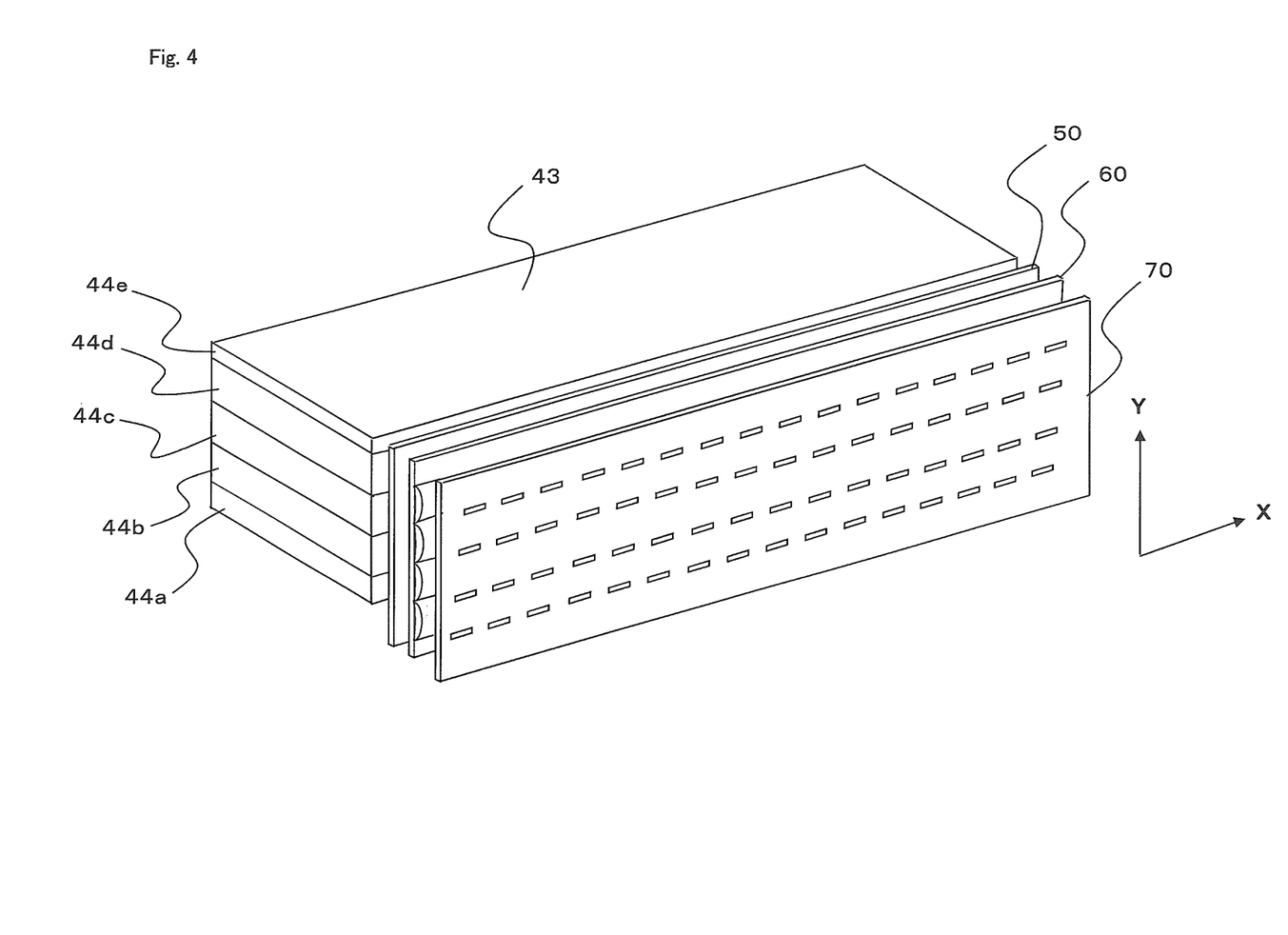
FIG. 4 is a perspective view showing a holder, a fly-eye lens, a cylindrical lens array and an aperture array.
Figure 5:
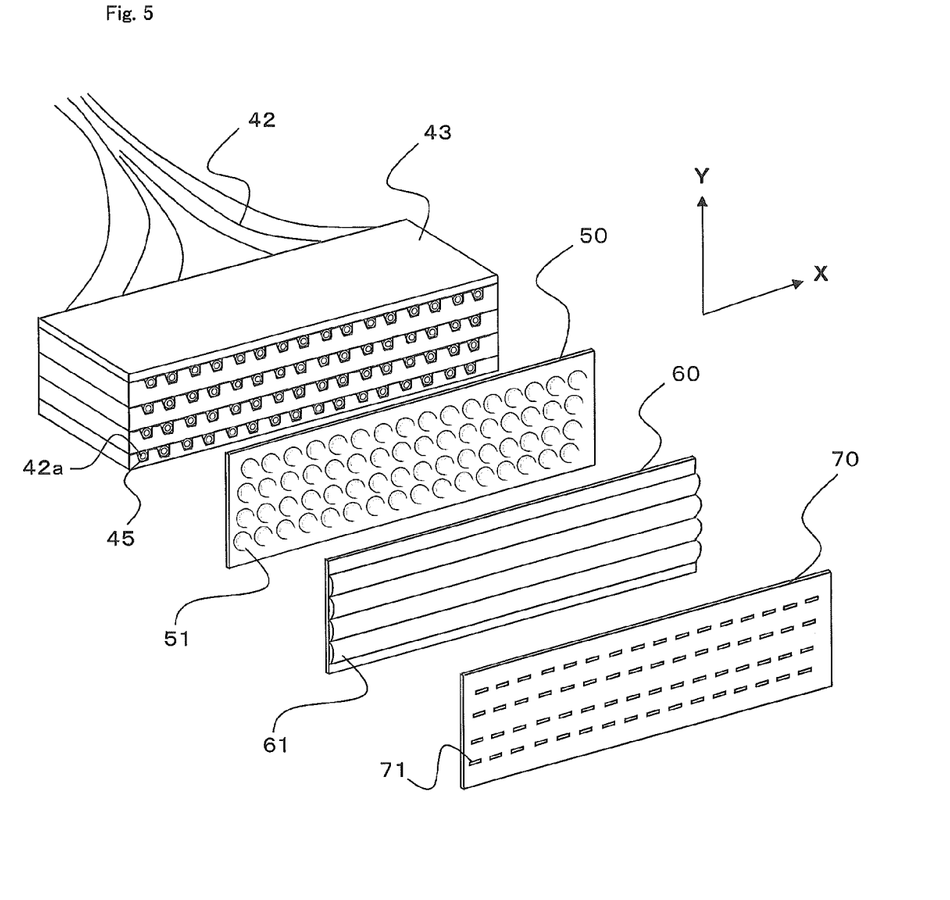
FIG. 5 is an exploded perspective view showing the holder, the fly-eye lens, the cylindrical lens array and the aperture array.

As shown in FIGS. 4 and 5, holder 43 is formed of five blocks 44 stacked along a Y-direction as viewed in the figures.

In the following description, these blocks will be differentiated from each other by referred to them as block 44a, 44b, 44c, 44d and 44e in order starting with the lowermost block (i.e. block 40a). However, this distinction is made only for convenience' sake.

Blocks 44a to 44d have bottom surfaces that are flat and upper surfaces on each of which sixteen grooves 45 are formed at equal intervals in parallel with each other. Grooves 45 each have a substantially rectangular sectional shape and are arranged along the longitudinal direction (X-direction) of blocks 44. Not only the bottom surface but also the upper surface of uppermost block 44e is flat. Each groove 45 is required to have such a sectional shape as to be capable of positioning optical fiber 42 and may have, for example, a V-shaped section.

One optical fiber 42 is disposed in each of grooves 45 formed in blocks 44a to 44d. That is, the terminal ends of sixteen optical fibers 42 are arranged along the X-direction on block 44a, and block 44b is superposed on block 44a. Consequently, the terminal ends of sixteen optical fibers 42 on block 44a are interposed between blocks 44a and 44b. Similarly, the terminal ends of sixteen optical fibers 42 on block 44b are interposed between blocks 44b and 44c; the terminal ends of sixteen optical fibers 42 on block 44c are interposed between blocks 44c and 44d; and the terminal ends of sixteen optical fibers 42 on block 44d are interposed between blocks 44d and 44e.

As shown in FIG. 5, the terminal ends of sixty-four optical fibers 42 are held by holder 43 as described above and thereby arranged in matrix form. In other words, sixty-four exit end surfaces 42a are arranged in matrix form (16×4) with a predetermined pitch in the front surface of holder 43. In still other words, the four rows of exit end surfaces each formed of sixteen exit end surfaces 42a arranged in a row along the X-direction are provided along the Y-direction. The pitch between the exit end surfaces in each row of exit end surfaces (the center-to-center distance between each adjacent pair of exit end surfaces) is 240 µm. Also, the distance from the exit end surface located at one end of one row of exit end surfaces to the exit end surface located at the other end thereof is 3.6 mm.

Referring again to FIG. 3, fly-eye lens 50, cylindrical lens array 60 and aperture array 70 are disposed in this order in front of holder 43.

As shown in FIG. 5, sixty-four lens elements 51 are formed in fly-eye lens 50. Those sixty-four lens elements 51 are arranged in matrix form with the same pitch as that of exit end surfaces 42a of optical fibers 42. That is, in fly-eye lens 50, four rows of lens elements each formed of sixteen lens elements 51 arranged in a row along the X-direction are formed along the Y-direction (16×4).

In cylindrical lens array 60, cylindrical lens elements 61 are formed in four stripes. Each stripe of cylindrical lens elements 61 corresponds to the row of lens elements at the same height. For example, the first (lowermost) stripe of cylindrical lens element 61 corresponds to the first (lowermost) row of lens elements. Also, the second (second-lowest) stripe of cylindrical lens element 61 corresponds to the second (second-lowest) row of lens elements.

Sixty-four apertures (openings) 71 are formed in aperture array 70. These apertures 71 are arranged in matrix form with the same pitch as that of lens elements 51 of fly-eye lens 50. In other words, apertures 71 are arranged in matrix form with the same pitch as that of exit end surfaces 42a of optical fibers 42. That is, on aperture array 70, four rows of apertures each formed of sixteen apertures 71 arranged in a row along the X-direction are formed along the Y-direction (16×4).

Laser lights emitted from exit end surfaces 42a of optical fibers 42 enter lens elements 51 that are opposite to exit end surfaces 42a. The light incidence surface of each lens element 51 is flat, while the light exit surface has a convex surface. That is, each lens element 51 is equivalent to a plano-convex lens. Laser light is collimated or converged by passing through lens element 51.

Laser light collimated or converged by each lens element 51 enters cylindrical lens element 61 that is opposite to lens element 51. More specifically, laser lights that passed through sixteen lens elements 51 that belong to one row of lens elements enter cylindrical lens element 61 that is opposite to this row of lens elements. Each cylindrical lens element 61 has a curvature along the Y-direction but has no curvature along the X-direction. Therefore, laser lights are collimated only along the Y-direction by passing through cylindrical lens element 61.

Figure 6:
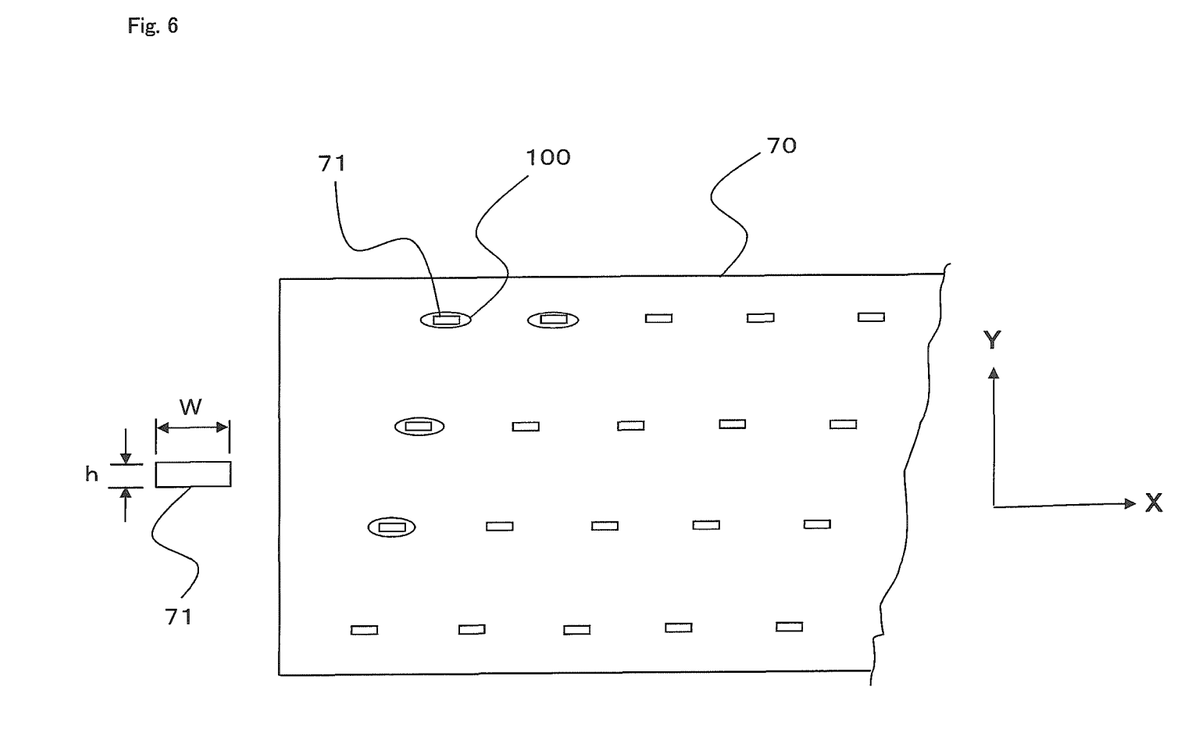
FIG. 6 is an enlarged view of a portion of the aperture array.

Consequently, spot 100 of laser light in the light incidence surface of aperture array 70 has an elliptical shape whose major-axis direction corresponds to the X-direction, as shown in FIG. 6. However, each aperture 71 has a rectangular shape of a 20 µm (h)×60 µm (W) size, as shown in FIG. 6. Spot 100 of laser light is shaped so as to be rectangular or substantially rectangular by passage through aperture 71.

Referring again to FIG. 3, lens 80a, shading plate 81 and lens 80b are disposed in this order in front of aperture array 70. The pair of lenses 80a and 80b forms a collective lens (image forming lens) that collects, on the surface of recording medium P, laser light that passed through apertures 71. Shading plate 81 is inserted in the optical path between lenses 80a and 80b as needed to obstruct the passage of laser light. For example, when the image recording apparatus is in a standby state or in a powered-off state, shading plate 81 is inserted in the optical path between lenses 80a and 80b. Lenses 80a and 80b may be replaced with one biconvex lens.

According to the present invention, as described above, each spot of laser light applied to a recording medium is shaped so as to be rectangular or substantially rectangular, thus eliminating a blur in each pixel formed by (exposure to) the laser light and obtaining a high-definition image.

Figure 7:
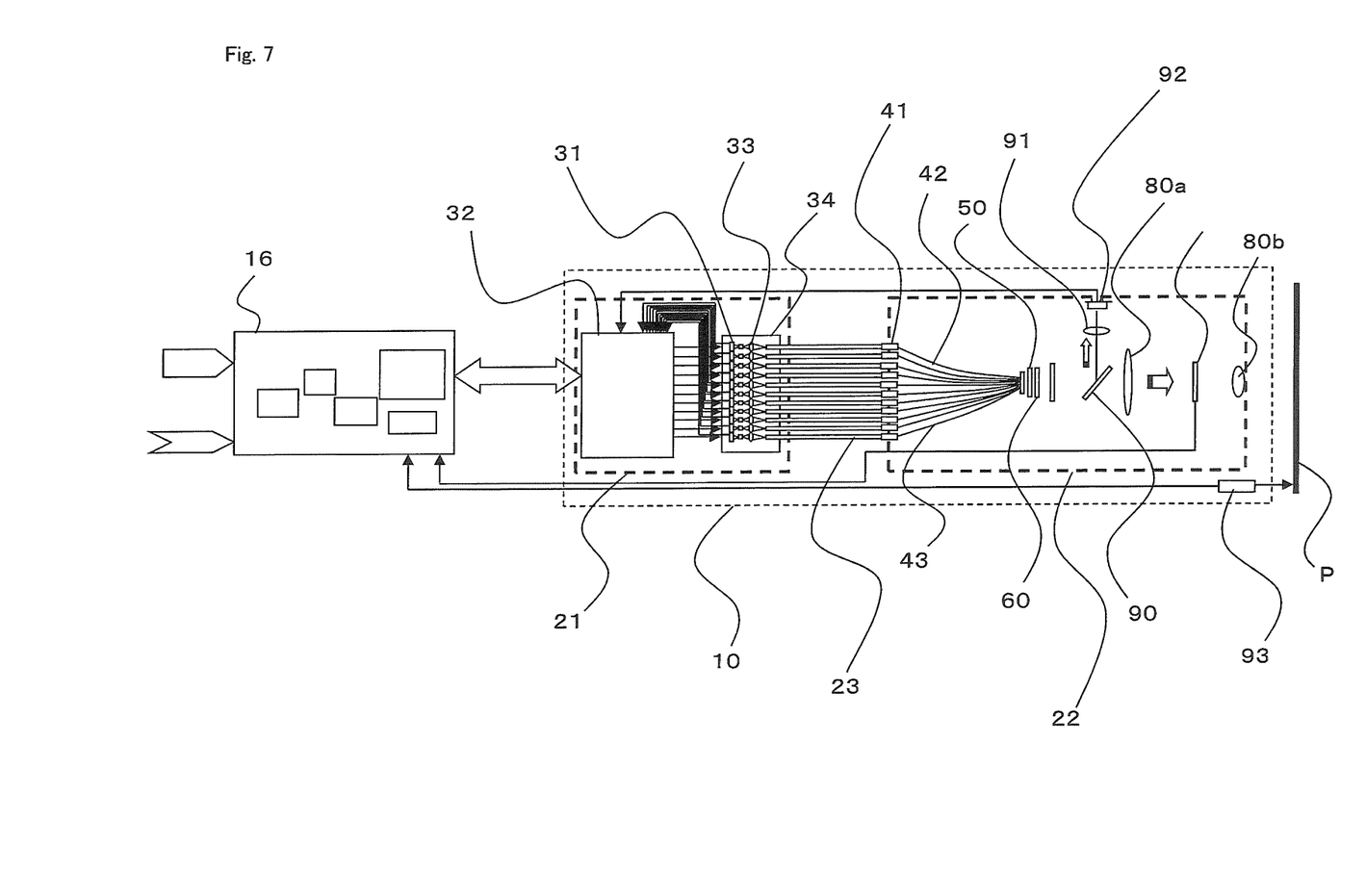
FIG. 7 is a detailed configuration diagram showing a variant of the image forming apparatus.

FIG. 7 shows a variant of image forming apparatus 10. Means for feedback-controlling semiconductor laser 31 and means for detecting edges of recording medium P are added to the illustrated image forming apparatus 10,. The feedback control means includes mirror 90, lens 91 and optical sensor 92. Mirror 90 is disposed between aperture array 70 and lens 80a and reflects part (e.g., 10%) of laser light that passed through aperture array 70. Lens 91 causes laser light reflected by mirror 90 to enter optical sensor 92. Optical sensor 92 outputs an electrical signal according to the intensity of the incoming laser light. The electrical signal output from optical sensor 92 is input to driver 32 to be used for control of semiconductor laser 31.

Edge detection means 93 optically detects an edge of recording medium P wrapped around rotating drum 11 (FIG. 1) and inputs a detection result to central control unit 16.

In the present embodiment, semiconductor laser 31 that has an oscillation wavelength of 830 nm is used. However, a semiconductor laser that has a different oscillation wavelength according to the recording medium may alternatively be used. For example, if the recording medium is a photopolymer plate, it is preferable to use a semiconductor laser that has an oscillation wavelength of about 400 nm An argon laser, a YAG laser or the like may be used in place of semiconductor laser 31.

In the present embodiment, the terminal ends of optical fibers 23 are detachably attached to optical recording head 22.

However, the starting ends of optical fibers 23 may be detachably attached to light source unit 21.

Further, while laser light is propagated by using two optical fibers (optical fibers 23 and 42) in the present embodiment, laser light may be propagated by means of only one optical fiber. For example, optical fibers 23 shown in FIGS. 3 and 7 may be extended so that the terminal ends of optical fibers 23 are held by holder 43. Optical fibers 42 may alternatively be extended so that the starting ends of optical fibers 42 are fixed on substrate 34.

While light source unit 21 and optical recording head 22 are provided separately from each other in the present embodiment, light source unit 21 and optical recording head 22 may be combined into one unit.

In this specification, an example of a CTP system has been described as one embodiment. The image forming apparatus and the optical recording head of the present invention, however, can also be applied to systems and apparatuses other than the CTP system. It will be understood by those skilled in the art that various changes in form and details may be made therein without departing from the scope of the present invention.

This application is based upon and claims the benefit of priority from the prior Japanese Application No. 2011-207493, filed on Sep. 22, 2011, the disclosure of which is incorporated herein in its entirety by reference.

REFERENCE SIGNS LIST

10 Image forming apparatus
21 Light source unit
22 Optical recording head
23 Optical fiber
31 Semiconductor laser
42 Optical fiber
43 Holder
50 Fly-eye lens
51 Lens element
60 Cylindrical lens array
61 Cylindrical lens element
70 Aperture array
71 Aperture
80*a*, 80*b* Lens

The invention claimed is:

1. An optical recording head for applying laser light respectively emitted from a plurality of optical fibers to a recording medium, the optical recording head comprising:
a holder that holds the plurality of optical fibers;
a fly-eye lens into which laser light respectively emitted from end surfaces of the plurality of optical fibers enters;
a cylindrical lens array into which laser light that passed through said fly-eye lens enters;
an aperture array into which laser light that passed through said cylindrical lens array enters;
a lens that collects, on a surface of the recording medium, laser light that passed through apertures of said aperture array,
wherein each of the apertures of said aperture array is rectangular,
wherein the lens that collects the laser light that passed through apertures of said aperture array comprises:
a first lens located between said aperture array and the recording medium; and
a second lens located between the first lens and the recording medium; and
a shading plate inserted in an optical path between the first lens and the second lens, said shading plate being configured to obstruct a passage of laser light that passed through the first lens.

2. The optical recording head according to claim 1, wherein the end surfaces of the plurality of optical fibers are arranged in a matrix form with a predetermined pitch,
wherein a plurality of lens elements on said fly-eye lens are arranged in the matrix form with a same pitch as that of the end surfaces of the plurality of optical fibers, and
wherein the apertures on said aperture array are arranged in the matrix form with the same pitch as that of the lens elements.

3. The optical recording head according to claim 2, wherein two or more rows of lens elements each formed of a plurality of the lens elements arranged along an X-direction are formed on said fly-eye lens along a Y-direction perpendicular to the X-direction,
wherein a plurality of cylindrical lens elements are formed on said cylindrical lens array in correspondence with the rows of lens elements on said fly-eye lens,
wherein each of the cylindrical lens elements has a curvature along the Y-direction without a curvature along the X-direction, and
wherein each of the apertures on said aperture array has a rectangular shape whose shorter-side direction corresponds to the Y-direction, and whose longer-side direction corresponds to the X-direction.

4. The optical recording head according to claim 1, wherein the end surfaces of the plurality of optical fibers are arranged in a matrix form with a predetermined pitch, and
wherein the apertures on said aperture array are arranged in the matrix form with the predetermined pitch.

5. The optical recording head according to claim 1, wherein a plurality of lens elements on said fly-eye lens are arranged in the matrix form with a predetermined pitch, and
wherein the apertures on said aperture array are arranged in the matrix form with the predetermined pitch.

6. The optical recording head according to claim 1, wherein the apertures of said aperture array are arranged in a matrix form including a plurality of rows each comprising the rectangular apertures and a plurality of columns each comprising the rectangular apertures.

7. The optical recording head according to claim 6, wherein a plurality of lens elements on said fly-eye lens are arranged in the matrix form with a predetermined pitch, and
wherein the rectangular apertures in the rows of said aperture array are arranged with the predetermined pitch.

8. An image forming apparatus for forming an image on a surface of a recording medium by applying laser light to the recording medium, the apparatus comprising:
a plurality of light sources each of which emits laser light;
a plurality of optical fibers through which laser light respectively emitted from said plurality of light sources propagates;
a holder that holds end portions of said plurality of optical fibers;
a fly-eye lens into which laser light respectively emitted from end surfaces of said plurality of optical fibers enters;
a cylindrical lens array into which laser light that passed through said fly-eye lens enters;
an aperture array into which laser light that passed through said cylindrical lens array enters;
a lens that collects, on a surface of the recording medium, laser light that passed through apertures of said aperture array, wherein each of the apertures of said aperture array is rectangular, wherein the lens that collects the laser light that passed through said apertures of said aperture array comprises:

a first lens located between said aperture array and the recording medium; and a second lens located between the first lens and the recording medium; and a shading plate inserted in an optical path between the first lens and the second lens, said shading plate being configured to obstruct a passage of laser light that passed through the first lens.

9. The image forming apparatus according to claim 8, wherein the end surfaces of said plurality of optical fibers are arranged in a matrix form with a predetermined pitch, wherein a plurality of lens elements on said fly-eye lens are arranged in the matrix form with a same pitch as that of the end surfaces of said plurality of optical fibers, and wherein the apertures on said aperture array are arranged in the matrix form with the same pitch as that of the lens elements.

10. The image forming apparatus according to claim 9, wherein two or more rows of lens elements each formed of a plurality of the lens elements arranged along an X-direction are formed on said fly-eye lens along a Y-direction perpendicular to the X-direction, wherein a plurality of cylindrical lens elements are formed on said cylindrical lens array in correspondence with the rows of lens elements on said fly-eye lens, wherein each of the cylindrical lens elements has a curvature along the Y-direction without a curvature along the X-direction, and wherein each of the apertures on said aperture array has a rectangular shape whose shorter-side direction corresponds to the Y-direction, and whose longer-side direction corresponds to the X-direction.

11. The image forming apparatus according to claim 8, wherein each of said light sources comprises a semiconductor laser, an argon laser, or a YAG laser.

12. The image forming apparatus according to claim 8, further comprising:

a light source unit including said light sources;

an optical recording head including said optical fibers, said holder, said fly-eye lens, said cylindrical lens array, and said aperture array; and second optical fibers that form, between said light source unit and said optical recording head, an optical waveguide for propagating the laser light emitted from said light sources to said optical recording head.

13. The image forming apparatus according to claim 12, wherein said second optical fibers is configured to be connected and disconnected with respect to said light source unit or said optical recording head or with respect to both said light source unit and said optical recording head.

14. The image forming apparatus according to claim 8, wherein the end surfaces of the plurality of optical fibers are arranged in a matrix form with a predetermined pitch, and wherein the apertures on said aperture array are arranged in the matrix form with the predetermined pitch.

15. The image forming apparatus according to claim 8, wherein a plurality of lens elements on said fly-eye lens are arranged in the matrix form with a predetermined pitch, and wherein the apertures on said aperture array are arranged in the matrix form with the predetermined pitch.

16. The image forming apparatus according to claim 8, wherein the apertures of said aperture array are arranged in a matrix form including a plurality of rows each comprising the rectangular apertures and a plurality of columns each comprising the rectangular apertures, wherein a plurality of lens elements on said fly-eye lens are arranged in the matrix form with a predetermined pitch, and wherein the rectangular apertures in the rows of said aperture array are arranged with the predetermined pitch.

* * * * *